(12) United States Patent
Hamaguchi et al.

(10) Patent No.: US 8,138,663 B2
(45) Date of Patent: Mar. 20, 2012

(54) LIGHT EMITTING DEVICE AND METHOD OF MANUFACTURING THE SAME

(75) Inventors: Yuichi Hamaguchi, Tokyo (JP); Noriyuki Banno, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 12/888,653

(22) Filed: Sep. 23, 2010

(65) Prior Publication Data

US 2011/0006664 A1    Jan. 13, 2011

(30) Foreign Application Priority Data

Sep. 30, 2009  (JP) ................. 2009-228036

(51) Int. Cl.
*H01J 1/62* (2006.01)
*H01S 5/00* (2006.01)
*H05B 33/00* (2006.01)

(52) U.S. Cl. ............ 313/358; 313/498; 257/10; 257/98; 372/50.121

(58) Field of Classification Search .................. 313/358, 313/498; 257/10, 98; 372/50.121
See application file for complete search history.

(56) References Cited

U.S. PATENT DOCUMENTS

| | | | |
|---|---|---|---|
| 6,136,623 A | 10/2000 | Hofstetter et al. | |
| 6,956,322 B2 * | 10/2005 | Ikeda | 313/498 |
| 7,119,487 B2 * | 10/2006 | Ikeda | 313/498 |
| 7,486,540 B2 * | 2/2009 | Gouin et al. | 365/154 |
| 7,528,540 B2 * | 5/2009 | Ikeda | 313/498 |

FOREIGN PATENT DOCUMENTS

| | | |
|---|---|---|
| JP | 2004-119580 | 4/2004 |
| JP | 2007-234643 | 9/2007 |

* cited by examiner

*Primary Examiner* — Joseph L Williams
(74) *Attorney, Agent, or Firm* — SNR Denton US LLP

(57) ABSTRACT

The present invention provides a light emitting device solving weakness caused by bonding between first and second light emitting elements and a method of manufacturing the same. A chip-shaped first light emitting element and a second light emitting element overlapped each other are disposed on a supporting base. Four island-shaped projections are provided on the top face of the supporting base, and support the second light emitting element. The projections are formed by wet-etching or dry-etching the supporting base, and a pad electrode is provided on the top face of the projection. The pad electrode is electrically connected to the second light emitting element and is also electrically connected to a wire.

19 Claims, 6 Drawing Sheets

LIGHT EMITTING DEVICE AND METHOD OF MANUFACTURING THE SAME

BACKGROUND OF THE INVENTION

1. Field of the Invention

The present invention relates to a light emitting device having a plurality of light emitting elements and a method of manufacturing the same.

2. Description of the Related Art

In recent years, in the field of a semiconductor laser, a multiwavelength laser having a plurality of light emitting sections of different light emission wavelengths on the same substrate (or a base) is actively developed. The multiwavelength laser is used, for example, as a light source of an optical disk device.

In such an optical disk device, a laser beam in the 700 nm band is used for reproducing a CD (Compact Disk) and used for recording/reproducing a recordable optical disk such as a CD-R (CD Recordable), a CD-RW (CD Rewritable) or an MD (Mini Disk). A laser beam in the 600 nm band is used for recording/reproducing a DVD (Digital Versatile Disk). By mounting a multiwavelength laser on an optical disk device, any of existing optical disks of a plurality of kinds is recorded or reproduced. Further, a laser having a short wavelength (400 nm band) using a nitride-based III-V group compound semiconductor typified by GaN, AlGaN, and GaInN (hereinbelow, called a GaN-based compound semiconductor) is realized and is practically used as a light source of an optical disk of higher density. By using multiwavelength also for a short-wavelength laser, the applications are further expanded.

A 3-wavelength laser device (light emitting device) having such a GaN-based laser oscillator, which is manufactured, for example, by the following method is conventionally proposed. Specifically, first, a GaN-based compound semiconductor is grown on a GaN substrate to form a first light emitting element having a wavelength in the 400 nm band. On the same GaAs substrate, a second light emitting element is formed by providing an element in the 600 nm band by growing an AlGaInP-based compound semiconductor and an element in the 700 nm band by growing an AlGaAs-based compound semiconductor in parallel. The first and second light emitting elements are disposed so as to overlap in this order on a supporting base. In such a manner, conventionally, a 3-wavelength laser device is fabricated. In the conventional 3-wavelength laser device, heat generated in the second light emitting element is dissipated from the GaN substrate and the supporting base having excellent thermal conductivity, so that high heat dissipation efficiency is obtained.

Such a light emitting device is formed by, for example, mounting a first light emitting element on a supporting base, forming a plurality of gold bumps on the supporting base, and mounting a second light emitting element on the gold bumps and the first light emitting element (refer to Japanese Unexamined Patent Application Publication No. 2007-234643). The gold bump has a function of a heat sink for dissipating heat generated in the second light emitting element and a function of supplying power from the supporting base side to the second light emitting element.

SUMMARY OF THE INVENTION

In the manufacturing process, it is not easy to adjust the heights of all of the gold bumps before the second light emitting element is disposed to be the same, and the heights of the gold bumps are various. Consequently, in the case where the height of a gold bump is slightly greater than a desired height, the gold bump is pressed and deformed by the second light emitting element at the time of disposing the second light emitting element. When the gold bump is pressed and deformed, it means that weakness occurs in the gold bump. There is a problem of the possibility of occurrence of a trouble depending on the degree of weakness.

It is therefore desirable to provide a light emitting device solving weakness caused by bonding between first and second light emitting elements and a method of manufacturing the same.

A light emitting device according to an embodiment of the present invention includes: a supporting base having a projection on its top face; a first light emitting element disposed in a region in which the projection is not formed in the top face; and a second light emitting element disposed on the first light emitting element and the projection. The light emitting device further includes an extraction electrode and one or plural pad electrodes. The extraction electrode is formed in a region in which the projection is not formed in the top face and electrically connected to the first light emitting element. Each of the one or plural pad electrodes has a first connection face electrically connected to the second light emitting element and a second connection face electrically connected to an external conductive member and is formed on the top face of the projection.

A light emitting device according to an embodiment of the invention includes: a conductive supporting base having a projection on its top face; a first light emitting element disposed in a region in which the projection is not formed in the top face; and a second light emitting element disposed on the first light emitting element and the projection. The light emitting device further has an extraction electrode and one or plural pad electrodes. The extraction electrode is formed on a rear face of the supporting base and electrically connected to the supporting base. Each of the one or more pad electrodes has a first connection face electrically connected to the second light emitting element and a second connection face electrically connected to an external conductive member and is formed on the top face of the projection.

A method of manufacturing a light emitting device according to an embodiment of the invention includes the steps of:

preparing a supporting base having a projection on its top face, a first light emitting element, and a second light emitting element whose horizontal width is larger than that of the first light emitting element;

forming one or plural pad electrodes each having, on the top face of the projection, a first connection face electrically connected to the second light emitting element and a second connection face electrically connected to an external conductive member;

forming a mount electrode for mounting the first light emitting element and an extraction electrode electrically connected to the mount electrode in a region in which the projection is not formed in the top face; and disposing the first light emitting element on the mount electrode and disposing the second light emitting element on the first light emitting element and the first connection face.

A method of manufacturing a light emitting device according to an embodiment of the invention includes the steps of:

preparing a conductive supporting base having a projection on its top face, a first light emitting element, and a second light emitting element whose horizontal width is larger than that of the first light emitting element;

forming one or plural pad electrodes each having, on the top face of the projection, a first connection face electrically connected to the second light emitting element and a second connection face electrically connected to an external conductive member;

forming a mount electrode for mounting the first light emitting element in a region in which the projection is not formed in the top face;

forming, on a rear face of the supporting base, an extraction electrode electrically connected to the supporting base; and disposing the first light emitting element on the mount electrode and disposing the second light emitting element on the first light emitting element and the first connection face.

In the light emitting device and the method of manufacturing the same according to embodiments of the present invention, the second light emitting element is disposed on the first light emitting element and the first connection face of the pad electrode formed on the top face of the projection. With the configuration, for example, in the case where the projection is formed by wet-etching or dry-etching the supporting base and in the case where the projection is formed by a block, the projection is formed with precision and the heights of the projections do not vary.

In the light emitting device and the method of manufacturing the same according to embodiments of the present invention, the projections are formed with precision and the heights of the projections do not vary. Thus, there is no possibility that weakness occurs due to bonding between the first and second light emitting elements.

Other and further objects, features and advantages of the invention will appear more fully from the following description.

DETAILED DESCRIPTION OF THE PREFERRED EMBODIMENTS

Modes for carrying out the invention will be described in detail below with reference to the drawings. The description will be given in the following order.

1. Embodiment (FIGS. 1 to 6)
Example in which a supporting base is provided with four projections
Example in which an extraction electrode is provided on the top face of the supporting base
Example in which two light emitting elements are provided
2. Modifications
Example in which a supporting base is provided with two projections (FIG. 7)
Example in which a supporting base is provided with one projection (FIG. 8)
Example in which a step is provided in a projection on a supporting base (FIG. 9)
Example in which an extraction electrode is provided on the rear face of a supporting base (FIG. 10)
Example in which a light receiving element is provided rearward of a light emitting element (FIG. 11)
Example in which three light emitting elements are provided (FIG. 12)

Embodiment

Light Emitting Device

Figure 1:
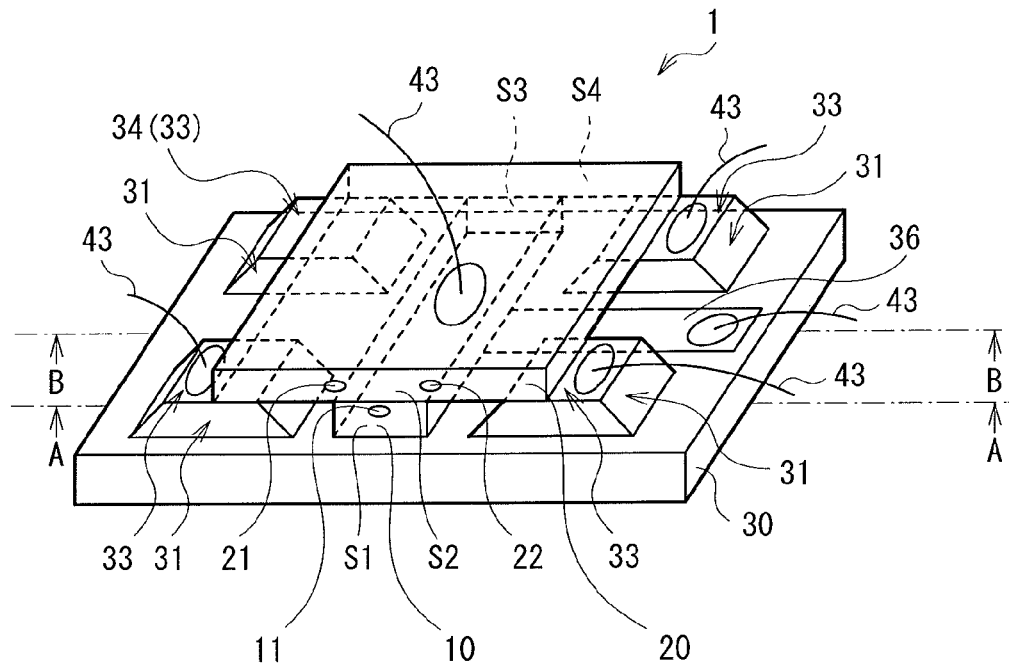
FIG. 1 is a perspective view of a light emitting device according to a first embodiment of the present invention.
Figure 2:
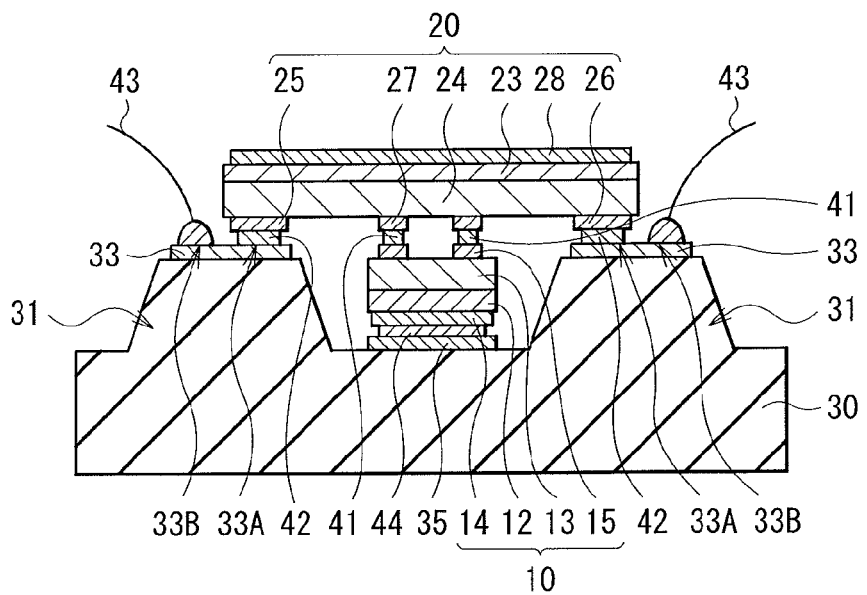
FIG. 2 is a cross section taken along line A-A of the light emitting device in FIG. 1.
Figure 3:
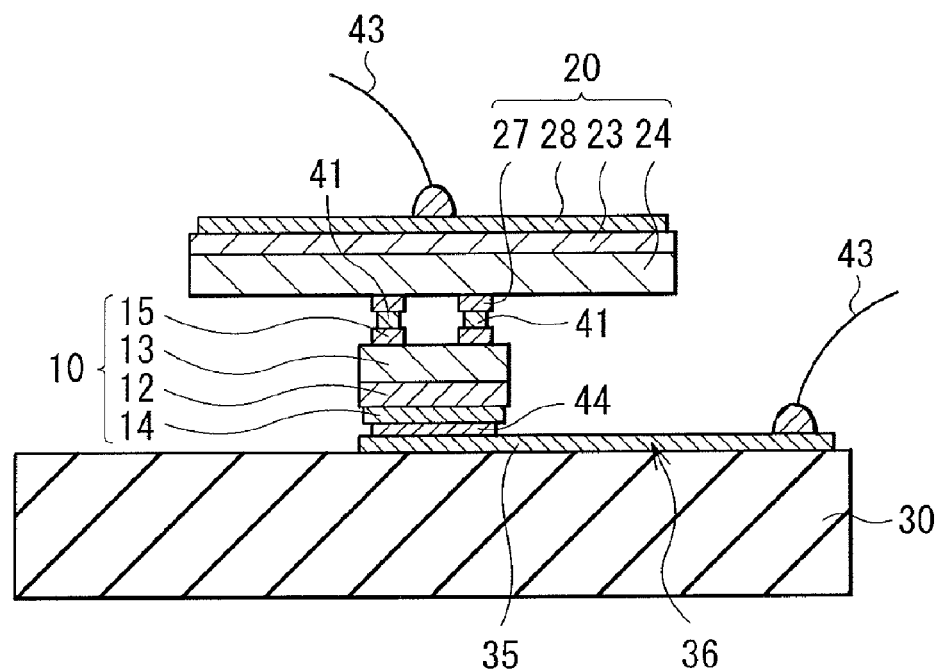
FIG. 3 is a cross section taken along line B-B of the light emitting device in FIG. 1.

FIG. 1 is a perspective view of a light emitting device 1 according to an embodiment of the present invention. FIG. 2 illustrates a sectional configuration taken along line A-A of the light emitting device 1 in FIG. 1. FIG. 3 illustrates a sectional configuration taken along line B-B of the light emitting device 1 in FIG. 1. The light emitting device 1 is suitably used as a light source of an optical disk device for recording/reproducing an optical disk.

The light emitting device 1 is obtained by stacking a first light emitting element 10 and a second light emitting element 20 in order on a supporting base 30 and has a function of a multiwavelength laser. The first and second light emitting elements 10 and 20 are chip-type semiconductor lasers, and horizontal width (width in the direction orthogonal to a resonator direction) of the second light emitting element 20 is larger than that of the first light emitting element 10. The first and second light emitting elements 10 and 20 are overlapped so that their end faces S1 and S2 (FIG. 1) on the light emission side are aligned in the same plane. End faces S3 and S4 (FIG. 1) on the rear side of the first and second light emitting elements 10 and 20 may be aligned in the same plane or disposed in different planes. In the case where the end faces S3 and S4 are aligned in the same plane, it means that resonator lengths of the first and second light emitting elements 10 and 20 are equal to each other. On the other hand, in the case where the end faces S3 and S4 are disposed in different planes, it means that resonator lengths of the first and second light emitting elements 10 and 20 are different from each other.

The first light emitting element 10 is a semiconductor laser that emits a laser beam in, for example, the 400 nm band (for example, 405 nm) from a light emission point 11 and is made of a GaN-based compound semiconductor. In the first light emitting element 10, a GaN substrate 12 (FIG. 2) having high thermal conductivity such as about 130 W/(m·K) is used, and the GaN substrate 12 functions as a heat sink that dissipates heat generated in the light emitting elements 10 and 20. In the first light emitting element 10, a GaN-based semiconductor layer 13 including the light emission point 11 is provided on the GaN substrate 12. Further, an electrode 14 is provided on the under face side (on the GaN substrate 12 side) of the first light emitting element 10, and an electrode 15 is provided on the top face side of the first light emitting element 10 (the semiconductor layer 13 side). The electrodes 14 and 15 are made of a metal material having high thermal conductivity such as gold.

The second light emitting element 20 is a monolithic multiwavelength laser and includes two kinds of semiconductor laser structures that emit, for example, a laser beam in the 600 nm band (for example, 650 nm) and a laser beam in the 700 nm band (for example, 780 nm) from two light emission points 21 and 22. In the second light emitting element 20, the two light emission points 21 and 22 are disposed on the supporting base 30 so as to be close to the light emission point 11 of the first light emitting element 10 by a so-called junction-down method. The laser structure in the 600 nm band is constructed by an AlGaInP-based compound semiconductor, and the laser structure in the 700 nm band is constructed by an AlGaAs-based compound semiconductor. In the second light emitting element 20, a GaAs substrate 23 having low thermal conductivity such as about 17.8 W/(m·K) is used. In other words, in the embodiment, heat generated in the second light emitting element 20 is conducted to the supporting base 30 side via the first light emitting element 10, not to the GaAs substrate 23 side.

In the second light emitting element 20, a GaAs-based semiconductor layer 24 including the light emission points 21 and 22 is provided on the GaAs substrate 23. Two electrodes 25 and 26 and a wiring pattern 27 are provided on the under face side (the semiconductor layer 24 side) of the second light emitting element 20. An electrode 28 is provided on the top face side (the GaAs substrate 23 side) of the second light emitting element 20. The electrode 25 functions as an electrode of the laser on the light emission point 21 side, and the electrode 26 functions as an electrode of the laser on the light emission point 22 side. The electrode 28 functions as an electrode common to both of the laser on the light emission point 21 side and the laser on the light emission point 22 side. The electrodes 25, 26, and 28 and the wiring pattern 27 are made of a metal material having high thermal conductivity such as gold.

The first and second light emitting elements 10 and 20 are bonded to each other, for example, via a bonding layer 41 (FIG. 2). For example, as illustrated in FIG. 2, the electrode 15 of the first light emitting element 10 and the wiring pattern 27 of the second light emitting element 20 are bonded to each other via the bonding layer 41 and are electrically connected to each other. The bonding layer 41 is made of, for example, a metal alloy such as Au (gold)—Si (silicon), Au (gold)—Sn (tin), or Ag (silver)—Sn (tin), a resin adhesive, or the like.

The supporting base 30 is a plate-shaped sub-mount and is, for example, although not illustrated, disposed on a heat block via a bonding layer. The supporting base 30 is made of, for example, silicon or ceramic having high thermal conductivity as about 250 W/(m·K) and excellent thermal conductivity and functions as a heat sink that dissipates heat generated in each of the first and second light emitting elements 10 and 20. The bonding layer for bonding the supporting base 30 and the heat block is made of, for example, a metal alloy such as Au—Si, Au—Sn, or Ag—Sn, a resin adhesive, or the like. The heat block is made of, for example, a metal material such as copper or iron.

Figure 4:
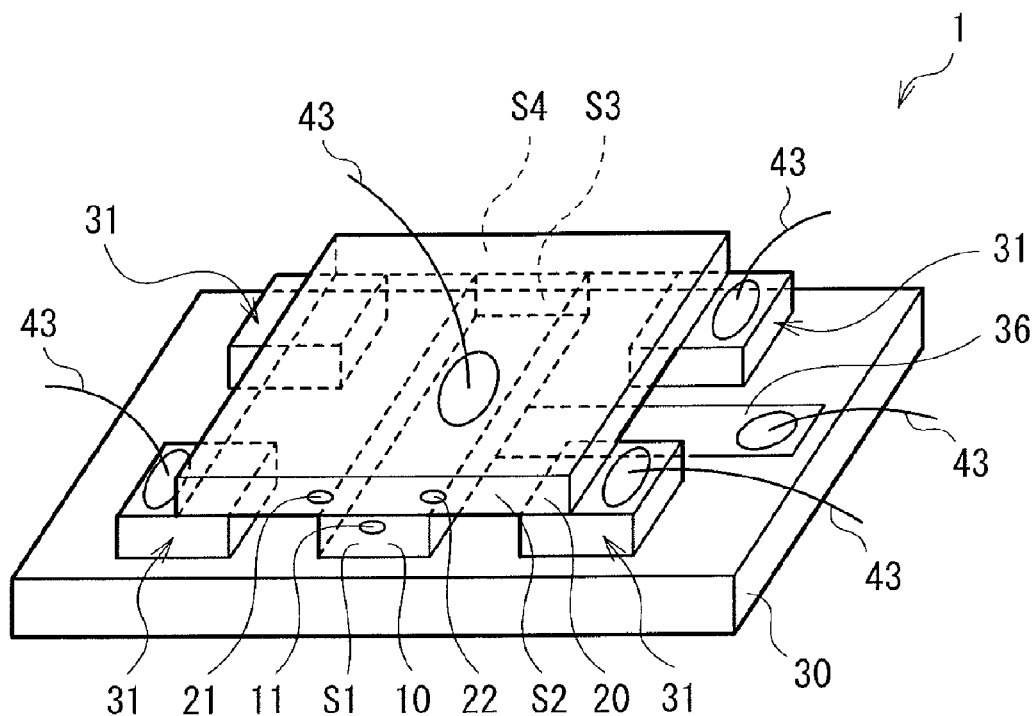
FIG. 4 is a perspective view of a first modification of the light emitting device of FIG. 1.

The supporting base 30 has, for example, as illustrated in FIGS. 1 to 3, four island-shaped projections 31 on the face (top face) on the side of the first and second light emitting elements 10 and 20. The four projections 31 are disposed, for example, as illustrated in FIG. 1 in correspondence with four corners of the second light emitting element 20 and support the second light emitting element 20. The number of the projections 31 may be properly changed as necessary. The projection 31 has, for example, as illustrated in FIGS. 1 to 3, a trapezoidal shape having inclined faces as side faces. The projection 31 may have a rectangular shape having, for example, as illustrated in FIG. 4, perpendicular faces as side faces. In other words, the shape of the projection 31 may be also properly changed as necessary.

Figure 5:
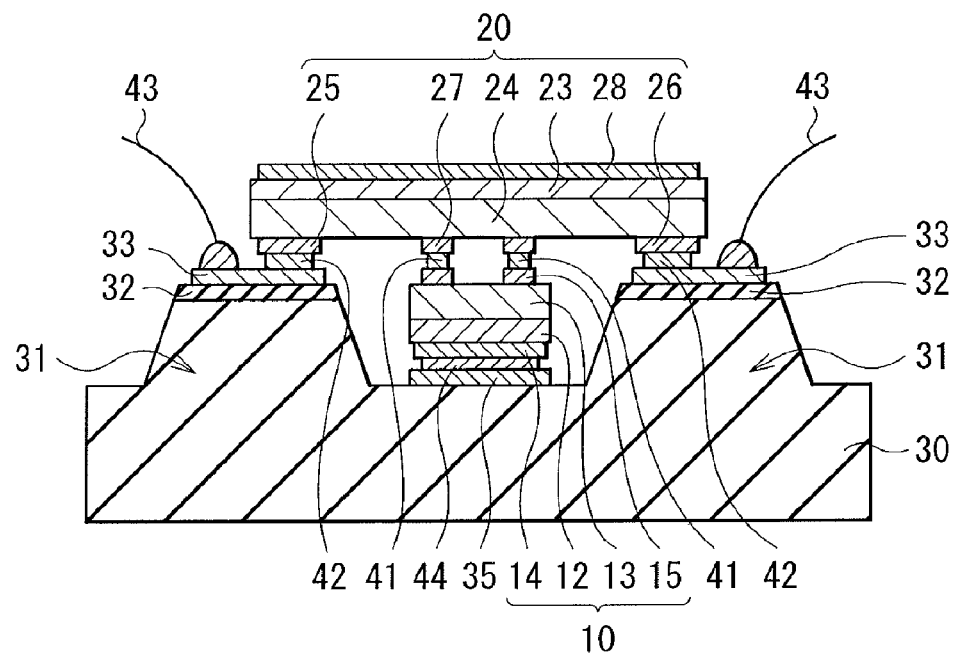
FIG. 5 is a cross section of a second modification of the light emitting device of FIG. 1.

The four projections 31 are made of the same material as that of the portion except for the projections 31 in the supporting base 30. The supporting base 30 including the four projections 31 are made of, for example, an insulating material (for example, non-doped silicon, lightly-doped silicon, or ceramic). The supporting base 30 including the four projections 31 may be made of, for example, a conductive material (such as highly-doped silicon). In this case, however, it is preferable to provide an insulating layer 32 between the top face of the projection 31 and a pad electrode 33 (described later) as illustrated in FIG. 5 so that the pod electrode 33 and a mount electrode 35 do not short-circuit with each other. The insulating layer 32 is made of, for example, silicon oxide.

The top face of each of the four projections 31 is, for example, a flat face as illustrated in FIGS. 1 to 3. The top faces of the four projections 31 are positioned substantially in the same plane. Preferably, the top faces of the four projections 31 are disposed substantially in the same plane as the top face of the first light emitting element 10 (the top face of the semiconductor layer 13) when the first light emitting element 10 is mounted on the supporting base 30. One pad electrode 33 is provided, for example, on the top face of each of the four projections 31. In other words, the pad electrodes 33 are provided between the top faces of the four projections 31 and the second light emitting element 20, and the four projections 31 support the second light emitting element 20 via the pad electrodes 33. The pad electrodes 33 are formed of, for example, a metal material having high thermal conductivity such as gold. The pad electrode 33 has a first connection face 33A electrically connected to the electrode 26 of the second light emitting element 20 via a bonding layer 42 and a second connection face 33B electrically connected to a wire 43 (external conductive member). The first connection face 33A is formed just below the electrode 26 of the second light emitting element 20, and the second connection face 33B is formed in a region which is not opposed to the second light emitting element 20. When the light emitting device 1 is seen from above, the second connection face 33B is exposed without being hidden by the second light emitting element 20. The bonding layer 42 is made of, for example, a metal alloy such as Au—Si, Au—Sn, or Ag—Sn, a resin adhesive, or the like.

Three pad electrodes 33 out of the pad electrodes 33 provided on the top faces of the four projections 31 one by one are actually coupled to the wire 43. However, the remaining one pad electrode 33 out of the four pad electrodes 33 is a dummy electrode 34 (FIG. 1) which is not actually coupled to the wire 43. The dummy electrode 34 is provided for the purpose of preventing the second light emitting element 20 from being inclined with respect to the supporting base 30 in a manufacturing process. Therefore, another member may be provided in place of the dummy electrode 34.

The mount electrode 35 (FIG. 2) is formed in a region in which the four projections 31 are not formed, in the top face of the supporting base 30. The mount electrode 35 is, for example, as illustrated in FIGS. 2 and 3, formed just below the electrode 14 of the first light emitting element 10 and has, for example, a band shape extending in the resonator direction of the first light emitting element 10. The mount electrode 35 is made of, for example, a metal material having high thermal conductivity such as gold and is electrically connected to the first light emitting element 10 via a bonding layer 44. The bonding layer 44 is made of, for example, a metal alloy such as Au—Si, Au—Sn, or Ag—Sn, a resin adhesive, or the like. In the case of using a metal alloy for the bonding layers 41, 42, and 44, the melting point of the metal alloy used for the bonding layer 44 is preferably higher than that of the metal alloy used for the bonding layers 41 and 42 to prevent the metal alloy used for bonding the first light emitting element 10 from being melted by the heat used for bonding the second light emitting element 20.

Further, in the region in which the four projections 31 are not formed in the top face of the supporting base 30, an extraction electrode 36 coupled to the mount electrode 35 is formed. For example, as illustrated in FIGS. 1 and 3, one end of the extraction electrode 36 is coupled to the mount electrode 35, and the other end of the extraction electrode 36 is formed in a region which is not opposed to the second light emitting element 20. In other words, the other end of the extraction electrode 36 is exposed without being hidden by the second light emitting element 20 when the light emitting device 1 is seen from above. The extraction electrode 36 is formed in the same plane as that of the mount electrode 35, and the mount electrode 35 and the extraction electrode 36 are formed on the flat face of the supporting base 30. Therefore, the mount electrode 35 and the extraction electrode 36 are formed in a lump in the manufacturing process.

Figure 6:
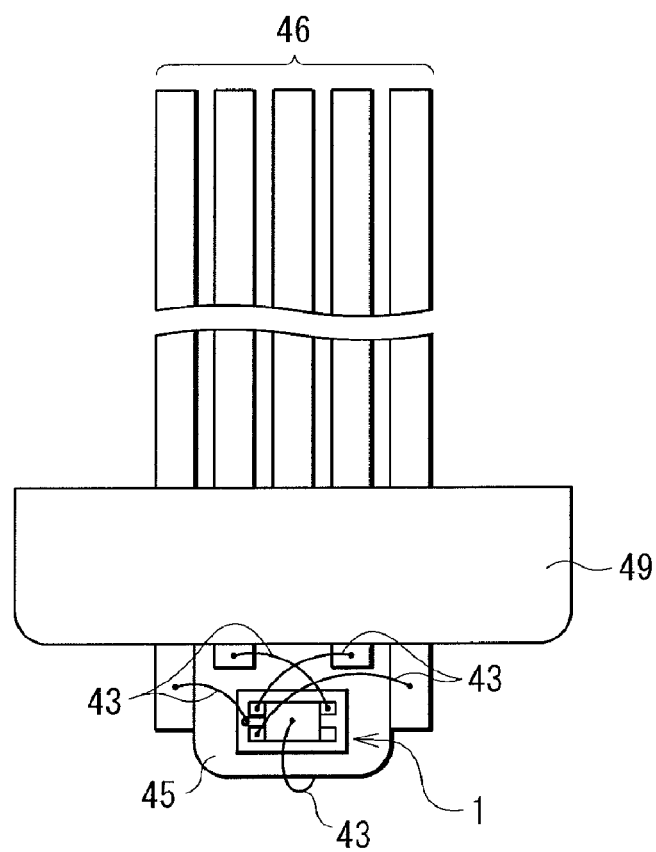
FIG. 6 is a plan view of a package.

FIG. 6 illustrates a state where the light emitting device 1 having such a configuration is mounted together with a heat block 45 on a package 49. To the three pad electrodes 33, the extraction electrode 36, and the electrode 28, the wires 43 led from connection terminals 46 of the package 49 are connected.

Manufacturing Method

Next, an example of a method of manufacturing the light emitting device 1 will be described. First, the supporting base 30 having four projections on its top face, the first light emitting element 10, and the second light emitting element 20 whose horizontal width is larger than that of the first light emitting element 10 are prepared.

The supporting base 30 is manufactured, for example, as follows. First, a mask (not illustrated) is formed in regions in which the top faces of the four projections 31 in the top face of the supporting base 30. Next, for example, the supporting base 30 is selectively removed by wet etching or dry etching. Thereafter, the mask is removed. As a result, the four projections 31 are formed in predetermined positions on the top face of the supporting base 30. The height of the four projections 31 is determined by process time of the etching. Therefore, the height of all of the projections 31 can be set precisely to a desired value, and the heights of all of the projections 31 can be made coincided accurately. In such a manner, the supporting base 30 is manufactured.

The pad electrode 33 is formed on each of the top faces of the four projections 31, and the mount electrode 35 for mounting the first light emitting element 10 and the extraction electrode 36 electrically connected to the first light emitting element 10 are formed in the regions in which the projections 31 are not formed in the top face of the supporting base 30. Next, the first light emitting element 10 is disposed on the mount electrode 35, and the second light emitting element 20 is disposed on the first light emitting element 10 and the first connection face 33A of the pad electrode 33. At this time, the first and second light emitting elements 10 and 20 which are bonded and integrated may be disposed, or the first light emitting element 10 is disposed on the mount electrode 35 and then the second light emitting element 20 may be disposed on the first light emitting element 10 and the first connection face 33A.

Next, as necessary, the supporting base 30 is fixed on the heat block 45 on the package 49 and then the wires 43 are bonded to the three pad electrodes 33, the extraction electrode 36, and the electrode 28. In such a manner, the light emitting device 1 of the embodiment is manufactured.

Although the supporting base 30 is an individual block in the above-mentioned manufacturing method, a sheet-shaped supporting base may be used. Specifically, first, a plurality of projections 31 are provided on a sheet-shaped supporting base 30, the pad electrode 33 is provided on the top face of each of the projections 31, and the mount electrode 35 and the extraction electrode 36 are formed in the regions in which the projections 31 are not formed in the top face of the supporting base 30. Next, the first light emitting element 10 is disposed on the mount electrode 35, and the second light emitting element 20 is disposed on the first light emitting element 10 and the first connection face 33A of the pad electrode 33. Thereafter, by cutting the supporting base 30 every four projections 31, the light emitting element 1 may be manufactured. In such a case, as compared with the case of manufacturing the light emitting devices 1 one by one, the trouble and time of manufacture can be reduced.

Operation

Next, the operation of the light emitting device 1 of the embodiment will be described. In the light emitting device 1, when a voltage from the power source is applied across the electrodes 14 and 15 of the first light emitting element 10 via the connection terminal 46 and the wire 43, a laser beam in the 400 nm band is emitted from the light emission point 11 of the first light emitting element 10. Similarly, when a voltage is applied across the electrode 28 of the second light emitting element 20 and the electrode 25 provided for the laser structure that emits a laser beam in the 600 nm band, a laser beam in the 600 nm band is emitted from the light emission point 21 of the second light emitting element 20. Further, similarly, when a voltage is applied across the electrode 28 of the second light emitting element 20 and the electrode 26 provided for the laser structure that emits a laser beam in the 700 nm band, a laser beam in the 700 nm band is emitted from the light emission point 22 of the second light emitting element 20. In other words, from the light emitting device 1, the laser beam in any one of the 400 nm band, the 600 nm band, and the 700 nm band is emitted.

In the case of emitting laser beams from the first and second light emitting elements 10 and 20, Joule heat due to high current density is generated on the inside. The pad electrode 33 on the supporting base 30 and the electrodes 25 and 26 of the second light emitting element 20 are electrically connected in shortest distance, and the mount electrode 35 on the supporting base 30 and the electrode 14 of the first light emitting element 10 are electrically connected in shortest distance. Further, the electrode 15 of the first light emitting element 10 and the wiring pattern 27 of the second light emitting element 20 are electrically connected in shortest distance. With the configuration, thermal conductivity is excellent (heat dissipation performance is high). Therefore, heat generated in the first light emitting element 10 is dissipated from the first light emitting element 10, also conducted to the supporting base 30 and the heat block 45 having high thermal conductivity, and dissipated. Heat generated in the second light emitting element 20 is dissipated from the second light emitting element 20, also conducted to the first light emitting element 10, the supporting base 30, the heat block 45, and the like having high thermal conductivity, and dissipated. As a result, characteristic deterioration due to heat generation and the like is suppressed.

In the embodiment, the second light emitting element 20 is disposed on the first light emitting element 10 and the projection 31. The projection 31 is made of the same material as that of the portion except for the projections 31 in the supporting base 30. It means that the projection 31 has hardness which is high enough to support the second light emitting element 20 at normal process temperature. There is consequently no possibility that the projections 31 become soft and are pressed and deformed by the second light emitting element 20 at the time of joining the electrodes 25 and 26 and the wiring pattern 27 to the electrode 15 and the first connection face 33A in the manufacture process. As a result, the projections 31 firmly support the second light emitting element 20 also in the manufacture process, so that occurrence of an inconvenience caused by deformation of the projections 31 like in the case of using gold bumps in place of the projections 31 is prevented.

In the embodiment, in the case where the four projections 31 are formed by wet etching or dry etching, all of the projections 31 are formed with high precision, and variations in the height of the four projections 31 which occur in the case of using gold bumps do not occur. Consequently, there is no possibility that a gap is created between the electrodes 25 and 26 and the first connection face 33A and between the wiring pattern 27 and the electrode 15 when the second light emitting element 20 is disposed on the first light emitting element 10 and the projections 31 in the manufacture process. As a result, conduction between the electrodes 25 and 26 and the first connection face 33A and conduction between the wiring pattern 27 and the electrode 15 can be obtained reliably. Therefore, occurrence of an inconvenience caused by variations in the height of the projections 31 like in the case of using gold bumps in place of the projections 31 is prevented.

In the embodiment, since the second light emitting element 20 disposed on the first light emitting element 10 is supported by the four projections 31 formed on the supporting base 30, the horizontal width of the first light emitting element 10 as an underlayer of the second light emitting element 20 is made shorter than that of the second light emitting element 20. The chip size of the first light emitting element 10 is therefore made smaller than that in the case where the second light emitting element 20 is supported only by the first light emitting element 10, so that the chip yield at the time of manufacturing the first light emitting element 10 becomes higher. As a result, the manufacturing cost of the light emitting device 1 is reduced.

Since the first and second light emitting elements 10 and 20 are joined to the supporting base 30, unlike the related art, it is unnecessary to form gold bumps, it does not take time and effort to manufacture the supporting base 30, and gold bumps do not come off. Therefore, the second light emitting element 20 is easily mounted on the supporting base 30, and reliability of the light emitting device 1 improves.

In the case of joining the first and second light emitting elements 10 and 20 in this order to the supporting base 30 with metal alloy, the melting point of the metal alloy used for joining the first light emitting element 10 is made higher than that of the metal alloy used for joining the second light emitting element 20. It prevents that, at the time of joining the second light emitting element 20, the metal alloy used for joining the first light emitting element 1 melts, and the first light emitting element 10 moves.

Modification

A modification of the foregoing embodiment will be described below.

Figure 7:
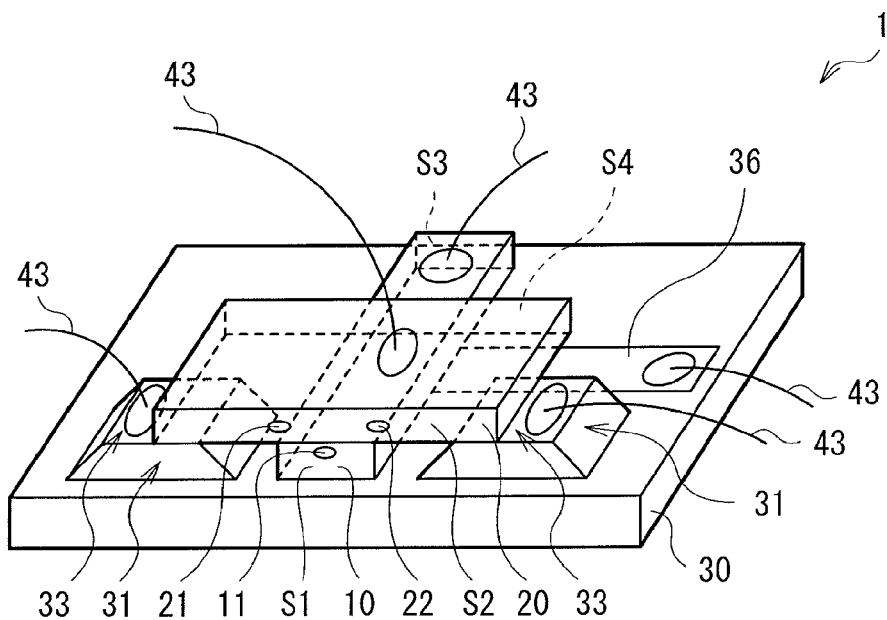
FIG. 7 is a perspective view of a third modification of the light emitting device of FIG. 1.
Figure 8:
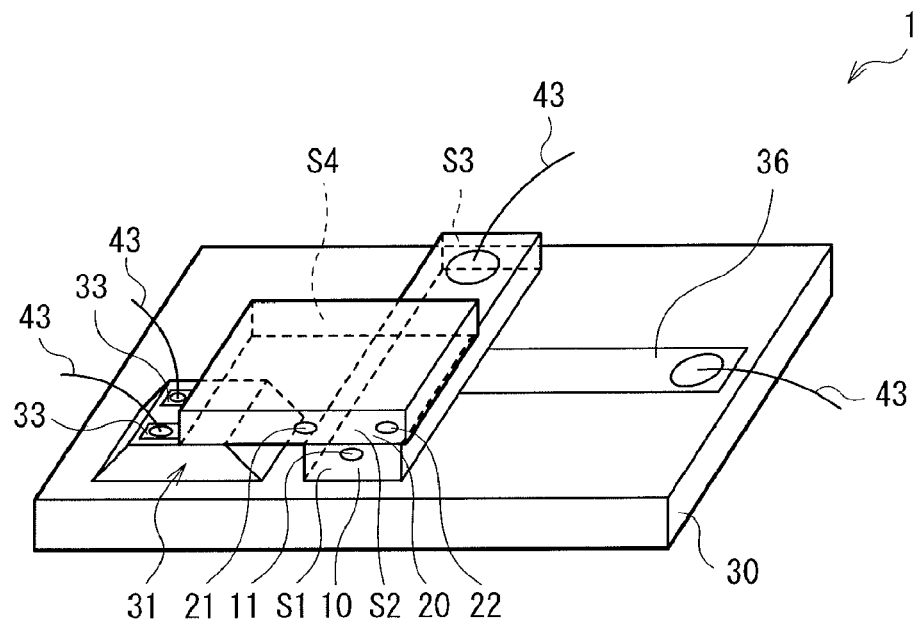
FIG. 8 is a perspective view of a fourth modification of the light emitting device of FIG. 1.

Although the second light emitting element 20 is supported by the four projections 31 in the foregoing embodiment, for example, as illustrated in FIGS. 7 and 8, the second light emitting element 20 may be supported by two or one projections 31. In the case of FIGS. 7 and 8, the wire 43 has to be bonded directly to the electrode 15 of the first light emitting element 10.

In the foregoing embodiment, one pad electrode 33 is provided on the top face of each of the projections 31. For example, as illustrated in FIG. 8, two pad electrodes 33 may be provided on the top face of one projection 31. In this case, however, on the top face of the projection 31, one of the pad electrodes 33 and the other pad electrode 33 have to be insulated from each other. In the case where only one projection 31 is provided on the top face of the supporting base 30, only one pad electrode 33 may be provided on the top face of the projection 31. In this case, however, although not illustrated, the other pad electrode 33 has to be formed in the portion other than the top face of the projection 31.

Figure 9:
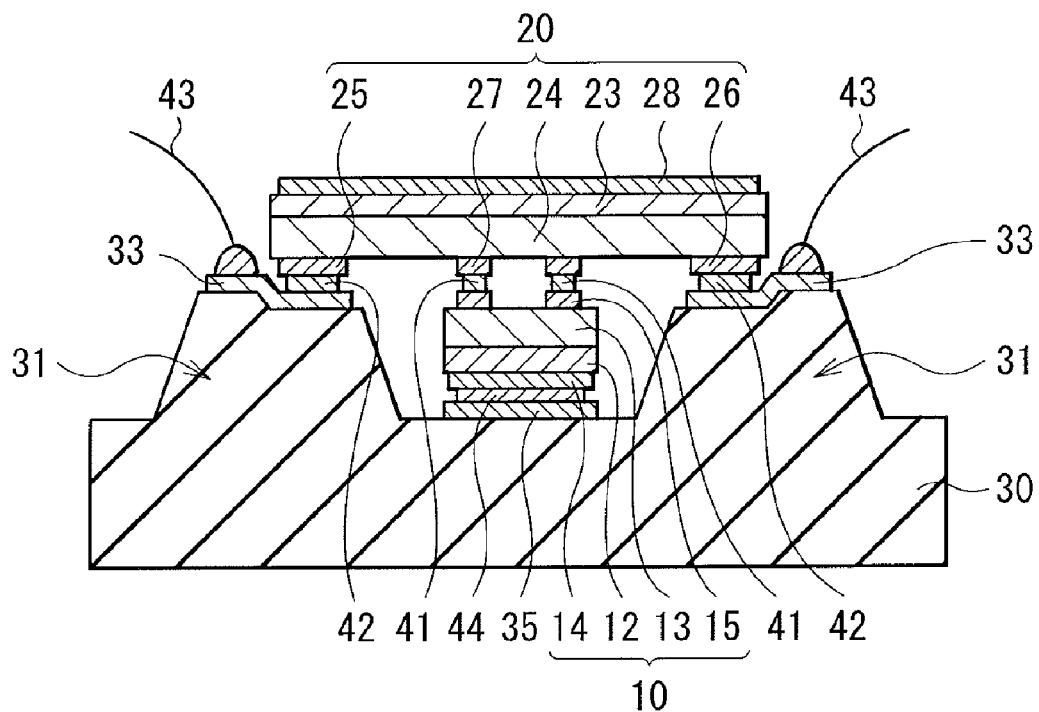
FIG. 9 is a cross section of a fifth modification of the light emitting device of FIG. 1.

Although the top face of each of the projections 31 is a flat face in the foregoing embodiment, for example, as illustrated in FIG. 9, the top face may have a step. In this case, preferably, the first connection face 33A of the pad electrode 33 is formed in a relatively low position, and the second connection face 33B of the pad electrode 33 is formed in a relatively high position. In such a case, the bonding layer 42 on the first connection face 33A is reliably prevented from wetting the second connection face 33B.

Figure 10:
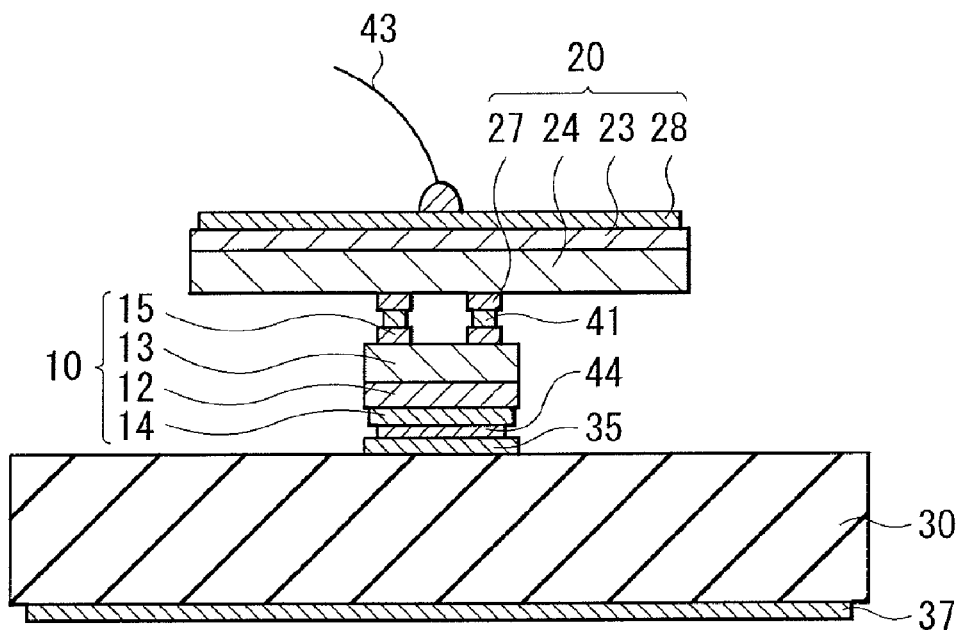
FIG. 10 is a cross section of a sixth modification of the light emitting device of FIG. 1.

Although the extraction electrode 36 is formed on the top face side of the supporting base 30 in the foregoing embodiment, for example, as illustrated in FIG. 10, the extraction electrode 36 may not be provided but, instead, an extraction electrode 37 may be formed on the rear face of the supporting base 30. In this case, the supporting base 30 has to be made of a conductive material (for example, highly-doped silicon), and the extraction electrode 37 has to be electrically connected to the supporting base 30. Since the extraction electrode 37 is formed on the flat face which is the rear face of the supporting base 30, the extraction electrodes 37 are formed in a lump in the manufacturing process.

An example of the method of manufacturing a light emitting device of the modification will be described. First, the supporting base 30 having four projections on its top face, the first light emitting element 10, and the second light emitting element 20 whose horizontal width is larger than that of the first light emitting element 10 are prepared. Next, the pad electrode 33 is formed on the top face of each of the four projections 31, the mount electrode 35 for mounting the first light emitting element 10 is formed in the regions in which the projections 31 are not formed in the top face of the supporting base 30, and the extraction electrode 37 is formed on the rear face of the supporting base 30. Next, the first light emitting element 10 is disposed on the mount electrode 35, and the second light emitting element 20 is disposed on the first light emitting element 10 and the first connection face 33A of the pad electrode 33. In such a manner, the light emitting device according to the modification is manufactured.

Figure 11:
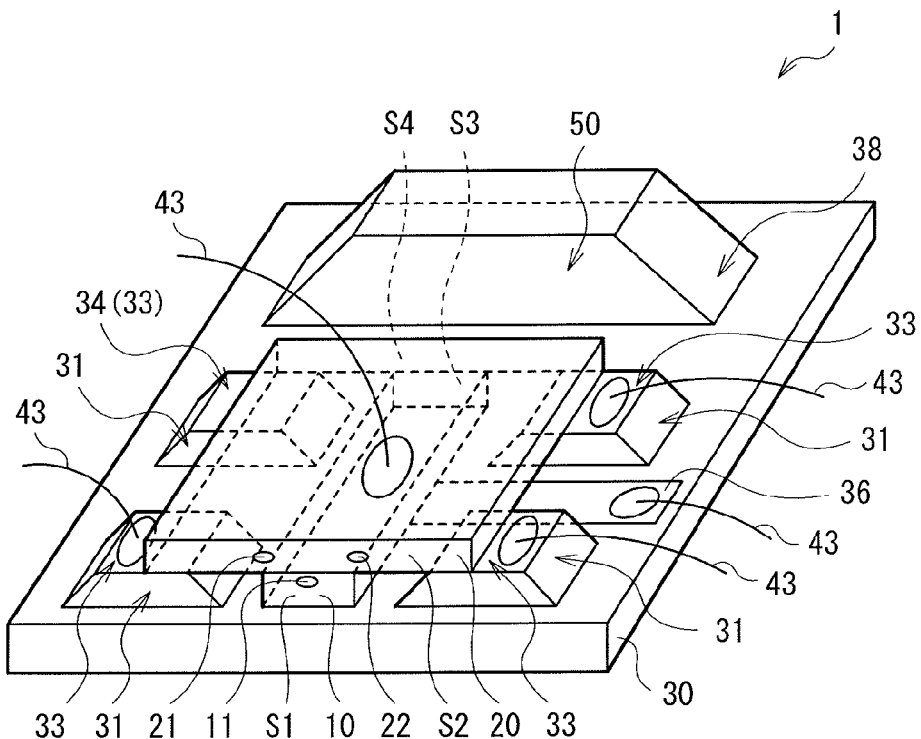
FIG. 11 is a perspective view of a seventh modification of the light emitting device of FIG. 1.
Figure 12:
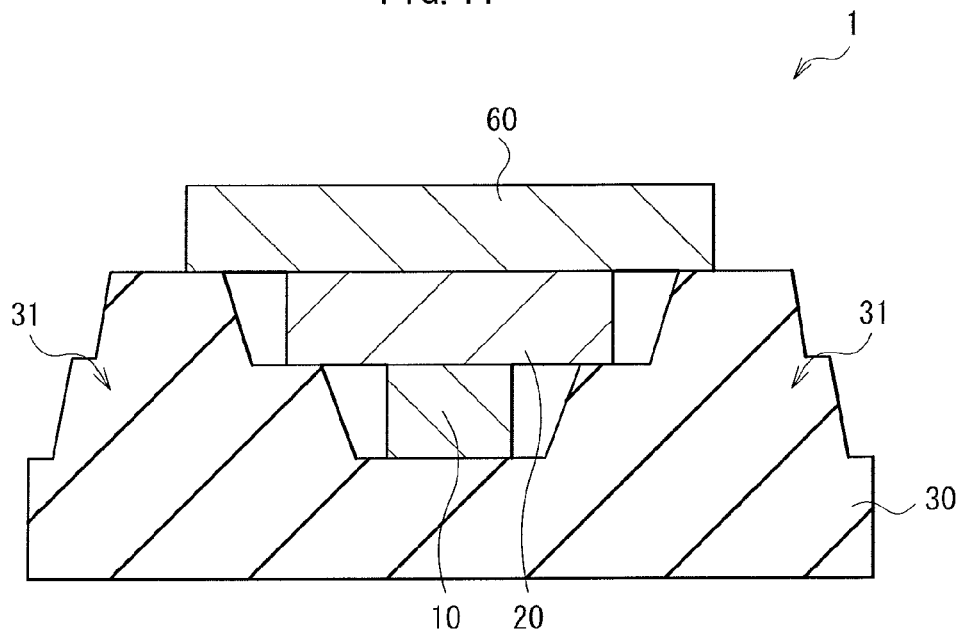
FIG. 12 is a cross section of an eighth modification of the light emitting device of FIG. 1.

Although nothing is provided on the rear side of the first and second light emitting elements 10 and 20 in the foregoing embodiment, for example, as illustrated in FIG. 11, a light receiving element 50 for detecting light slightly leaked from the end faces S3 and S4 may be provided. The light receiving element 50 may be formed, for example, on a side face (inclined face) of a projection 38 provided on the top face of the supporting base 30, the top face of the projection 38, or the like.

Although two light emitting elements (the first and second light emitting elements 10 and 20) are overlapped on the supporting base 30 in the foregoing embodiment, three or more light emitting elements may be overlapped. For example, as illustrated in FIG. 12, the first and second light emitting elements 10 and 20 and a third light emitting element 60 are overlapped in order on the supporting base 30. Preferably, a step is provided in a side face of the projection 31 and the second light emitting element 20 is supported by a flat face formed by the step.

In the foregoing embodiment, the projection 31 is formed by etching the supporting base 30 and is made of the same material as that of the portion other than the projections 31 in the supporting base 30. The projection 31 may be made of a material different from that material of the portion other than the projections 31 in the supporting base 30. In this case, the projection 31 may be made of an insulting material or a conductive material. In the case where the projection 31 is made of a conductive material, an insulating layer has to be provided between the top face of the projection 31 and the pad electrode 33. In the case where the projection 31 is made of a conductive material, the projection 31 is made by, for example, a semiconductor block or a metal block. In the case where the projection 31 is made of an insulating material, the projection 31 is made by, for example, a ceramic block.

The present application contains subject matter related to that disclosed in Japan Priority Patent Application JP 2009-228036 filed in the Japan Patent Office on Sep. 30, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
a supporting base having a projection on its top face;
a first light emitting element disposed in a region in which the projection is not formed in the top face;
a second light emitting element disposed on the first light emitting element and the projection;
one or plural pad electrodes each having a first connection face electrically connected to the second light emitting element and a second connection face electrically connected to an external conductive member and formed on the top face of the projection; and
an extraction electrode formed in a region in which the projection is not formed in the top face and electrically connected to the first light emitting element.

2. The light emitting device according to claim 1, wherein the projection is made of the same material as that of a portion other than the projection in the supporting base.

3. The light emitting device according to claim 2, wherein an insulating layer is provided on the top face of the projection, and
the supporting base is made of a conductive material.

4. The light emitting device according to claim 3, wherein the conductive material is highly-doped silicon.

5. The light emitting device according to claim 2, wherein the supporting base is made of an insulating material.

6. The light emitting device according to claim 5, wherein the insulating material is non-doped silicon or lightly-doped silicon.

7. The light emitting device according to claim 1, wherein the projection is formed by wet-etching or dry-etching the supporting base.

8. The light emitting device according to claim 1, wherein the projection is made of a material different from that of a portion other than the projection in the supporting base.

9. The light emitting device according to claim 8, wherein the projection is made of an insulating material.

10. The light emitting device according to claim 9, wherein the projection is a ceramic block.

11. The light emitting device according to claim 8, wherein an insulating layer is provided on the top face of the projection, and
the projection is made of a conductive material.

12. The light emitting device according to claim 11, wherein the projection is a semiconductor block or a metal block.

13. The light emitting device according to claim 1, wherein the top face of the projection is a flat face.

14. The light emitting device according to claim 1, wherein the second connection face is formed in a position higher than the first connection face.

15. A light emitting device comprising:
a conductive supporting base having a projection on its top face;
a first light emitting element disposed in a region in which the projection is not formed in the top face;
a second light emitting element disposed on the first light emitting element and the projection;
one or plural pad electrodes each having a first connection face electrically connected to the second light emitting element and a second connection face electrically connected to an external conductive member and formed on the top face of the projection; and
an extraction electrode formed on a rear face of the supporting base and electrically connected to the supporting base.

16. A method of manufacturing a light emitting device comprising the steps of:
preparing a supporting base having a projection on its top face, a first light emitting element, and a second light emitting element whose horizontal width is larger than that of the first light emitting element;
forming one or plural pad electrodes each having, on the top face of the projection, a first connection face electrically connected to the second light emitting element and a second connection face electrically connected to an external conductive member;
forming a mount electrode for mounting the first light emitting element and an extraction electrode electrically connected to the mount electrode in a region in which the projection is not formed in the top face; and
disposing the first light emitting element on the mount electrode and disposing the second light emitting element on the first light emitting element and the first connection face.

17. The method of manufacturing a light emitting device according to claim 16, wherein in the disposing step, the first and second light emitting elements are joined to each other and integrated, and the integrated elements are disposed.

18. The method of manufacturing a light emitting device according to claim 16, wherein in the disposing step, the first light emitting element is disposed on the mount electrode and the second light emitting element is then disposed on the first light emitting element and the first connection face.

19. A method of manufacturing a light emitting device comprising the steps of:
preparing a conductive supporting base having a projection on its top face, a first light emitting element, and a second light emitting element whose horizontal width is larger than that of the first light emitting element;
forming one or plural pad electrodes each having, on the top face of the projection, a first connection face electrically connected to the second light emitting element and a second connection face electrically connected to an external conductive member;

forming a mount electrode for mounting the first light emitting element in a region in which the projection is not formed in the top face;

forming, on a rear face of the supporting base, an extraction electrode electrically connected to the supporting base; and disposing the first light emitting element on the mount electrode and disposing the second light emitting element on the first light emitting element and the first connection face.

* * * * *